United States Patent
Lee et al.

(10) Patent No.: US 11,333,979 B2
(45) Date of Patent: May 17, 2022

(54) METHODS OF FORMING A PATTERN AND METHODS OF FABRICATING A SEMICONDUCTOR DEVICE

(71) Applicant: Samsung Electronics Co., Ltd., Suwon-si (KR)

(72) Inventors: Byounghoon Lee, Seoul (KR); Yongseok Jung, Seoul (KR); Jumi Bang, Hwaseong-si (KR); Byoungsup Ahn, Seongnam-si (KR)

(73) Assignee: Samsung Electronics Co., Ltd.

( * ) Notice: Subject to any disclaimer, the term of this patent is extended or adjusted under 35 U.S.C. 154(b) by 200 days.

(21) Appl. No.: 16/801,613

(22) Filed: Feb. 26, 2020

(65) Prior Publication Data

US 2021/0026245 A1 Jan. 28, 2021

(30) Foreign Application Priority Data

Jul. 24, 2019 (KR) .................. 10-2019-0089754

(51) Int. Cl.
*G03F 7/095* (2006.01)
*H01L 21/027* (2006.01)
(Continued)

(52) U.S. Cl.
CPC .............. *G03F 7/095* (2013.01); *G03F 7/168* (2013.01); *G03F 7/2002* (2013.01); *G03F 7/2006* (2013.01); *G03F 7/2037* (2013.01); *G03F 7/26* (2013.01); *H01L 21/0274* (2013.01); *H01L 21/0277* (2013.01); *H01L 21/3081* (2013.01); *H01L 21/31144* (2013.01); *H01L 21/32139* (2013.01)

(58) Field of Classification Search
CPC ........ G03F 7/095; G03F 7/168; G03F 7/2002; G03F 7/2006; G03F 7/2037; G03F 7/26; G03F 7/0042; G03F 7/093; G03F 1/56; G03F 1/76; G03F 7/2012; G03F 7/38; G03F 7/70033; H01L 21/0274; H01L 21/0277; H01L 21/3081; H01L 21/31144; H01L 21/32139; H01L 21/027; C08L 65/00
USPC ........................................... 438/703
See application file for complete search history.

(56) References Cited

U.S. PATENT DOCUMENTS

| | | |
|---|---|---|
| 5,560,870 A | 10/1996 | Watanabe et al. |
| 8,313,892 B2 | 11/2012 | Kon |

(Continued)

FOREIGN PATENT DOCUMENTS

| | | |
|---|---|---|
| JP | H1197325 | 4/1994 |
| JP | 3112745 | 11/2000 |

(Continued)

OTHER PUBLICATIONS

Wang et al. "Tuning the Conductivity of Polyaniline through Doping by Means of Single Precursor Vapor Phase Infiltration" Advanced Materials: Interfaces, 4(1600806):1-8 (2017).

*Primary Examiner* — Caleen O Sullivan
(74) *Attorney, Agent, or Firm* — Myers Bigel, P.A.

(57) ABSTRACT

Disclosed are methods of forming a pattern and methods of fabricating a semiconductor device. A method of fabricating a semiconductor device may include providing a substrate comprising a resist layer on the substrate and coating a compound on the resist layer to form a charge dissipation layer. The charge dissipation layer may include a conductive polymer and a metal complex.

20 Claims, 6 Drawing Sheets

(51) Int. Cl.
  *H01L 21/311*  (2006.01)
  *H01L 21/3213*  (2006.01)
  *H01L 21/308*  (2006.01)
  *G03F 7/16*  (2006.01)
  *G03F 7/20*  (2006.01)
  *G03F 7/26*  (2006.01)

(56) References Cited

U.S. PATENT DOCUMENTS

| | | | |
|---|---|---|---|
| 9,558,862 B2 | 1/2017 | Sawai et al. | |
| 2001/0044077 A1 | 11/2001 | Tan | |
| 2003/0194619 A1 | 10/2003 | Sasaki et al. | |
| 2005/0242330 A1* | 11/2005 | Herman | H01B 3/12 |
| | | | 252/570 |
| 2010/0209697 A1 | 8/2010 | Bowles et al. | |
| 2011/0293888 A1* | 12/2011 | Stowers | G03F 7/0043 |
| | | | 428/141 |
| 2012/0223418 A1* | 9/2012 | Stowers | C23C 18/1216 |
| | | | 257/632 |
| 2015/0140492 A1* | 5/2015 | Sawai | G03F 7/20 |
| | | | 430/296 |

FOREIGN PATENT DOCUMENTS

| | | |
|---|---|---|
| JP | 2003307856 | 10/2003 |
| KR | 1019980003872 | 3/1998 |
| KR | 101529022 | 6/2015 |

* cited by examiner

METHODS OF FORMING A PATTERN AND METHODS OF FABRICATING A SEMICONDUCTOR DEVICE

CROSS-REFERENCE TO RELATED APPLICATIONS

This U.S. non-provisional patent application claims priority under 35 U.S.C. § 119 to Korean Patent Application No. 10-2019-0089754, filed on Jul. 24, 2019, in the Korean Intellectual Property Office, the entire contents of which are hereby incorporated by reference.

BACKGROUND OF THE INVENTION

The present disclosure relates to a method of forming a pattern, and in particular, to a method of fabricating a semiconductor device using a charge dissipation layer.

To satisfy consumer demands for superior performance and inexpensive prices, it may be desired to increase an integration density and reliability of a semiconductor device. As the integration density of the semiconductor device is increased, a highly precise patterning method is needed for a process of fabricating a semiconductor device. An exposure process using a photoresist layer and a developing process can be performed to pattern an etch-target layer.

SUMMARY

An embodiment of the inventive concepts provides a method of improving precision in a patterning process for fabricating a semiconductor device.

An embodiment of the inventive concepts provides a method of forming fine-pitch patterns at high accuracy.

According to an embodiment of the inventive concepts, a method of fabricating a semiconductor device may include providing a substrate comprising a resist layer on the substrate and coating a compound on the resist layer to form a charge dissipation layer. The charge dissipation layer may include a conductive polymer and a metal complex. Providing the substrate may include forming the resist layer on the substrate.

According to an embodiment of the inventive concepts, a method of forming a pattern may include providing a substrate comprising a resist layer on the substrate and forming a charge dissipation layer to cover the resist layer. The charge dissipation layer may include a material of Chemical Formula 1:

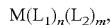  [Chemical Formula 1]

wherein: M is a transition metal; $L_1$ and $L_2$ are each independently a halogen element, —OR, OH, —SR, SH, —$NH_2$, $NR_2$, or —NRH, and R is a linear or branched alkyl having 1 to 5 carbon atoms; n and m are each independently an integer from 0 to 10; and a sum of n and m is an integer between 2 and 10. Providing the substrate may include forming the resist layer on the substrate.

According to an embodiment of the inventive concepts, a method of forming a pattern may include providing a substrate comprising a resist layer on the substrate, coating a composition on the resist layer to form an upper layer, and performing an exposure process on the upper layer. Providing the substrate may include forming the resist layer on the substrate. The composition may include a polymer including a hetero element and a material of Chemical Formula 1:

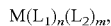  [Chemical Formula 1]

wherein: M is a transition metal; $L_1$ and $L_2$ are each independently a halogen element, —OR, OH, —SR, SH, —$NH_2$, $NR_2$, or —NRH, and R is a linear or branched alkyl having 1 to 5 carbon atoms; n and m are each independently an integer from 0 to 10; and a sum of n and m is an integer between 2 and 10.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structures and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the present specification, a 'substituted' or 'unsubstituted' component may mean a component that is substituted with one or more substituents selected from the group consisting of a hydrogen atom, a deuterium atom, a halogen atom, cycloalkyl, aryl, heteroaryl, heteroalicyclic, hydroxy, alkoxy, aryloxy, mercapto, alkylthio, arylthio, cyano, carbonyl, alkylamino, isocyanato, thiocyanato, isothiocyanato, nitro, silyl, alkyl sulfonyl, alkyl substituted with a sulfonyl group, and their derivatives or that is not substituted. In addition, each of the substituents mentioned as examples may be a substituted or unsubstituted substituent. For example, a methyl sulfone group may be interpreted as a sulfone group.

In the present specification, a halogen element may include fluorine, chlorine, iodine, and/or bromine.

In the present specification, an alkyl group may be a linear alkyl group, a branched alkyl group, or a cyclic alkyl group.

The carbon number of the alkyl group may be an alkyl group having 1 to 5 carbon atoms but is not limited thereto.

As used herein, when a chemical bond is not drawn at a position where a chemical bond should be drawn, it should be understood that a hydrogen atom is bonded at the position, unless a specific definition is otherwise provided.

In the present specification, the term "overlap" may be used to refer to a planar overlapping or a vertical overlapping.

In the present specification, the same reference number will be used to denote the same element.

Hereinafter, a composition according to an embodiment and methods of forming a pattern using the composition and of fabricating a semiconductor device will be described.

FIGS. 1, 2, 3A, 4, and 5 are diagrams illustrating a method of forming a pattern, according to an embodiment of the inventive concepts. FIG. 3B is an enlarged view of a portion 'I' of FIG. 3A.

Figure 1:
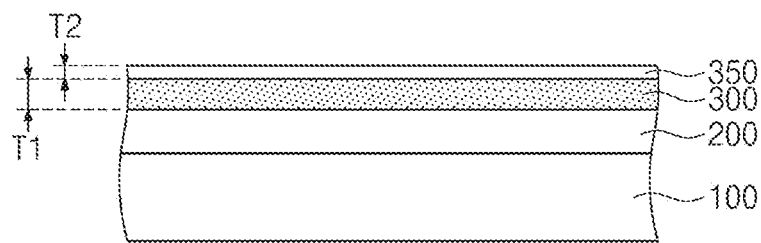
FIG. 1 is a plan view illustrating a resist pattern according to an embodiment of the inventive concepts.

Referring to FIG. 1, a lower layer 200, a resist layer 300, and a charge dissipation layer 350 may be stacked on a substrate 100. The lower layer 200 may be formed on a top surface of the substrate 100. The lower layer 200 may be an etch-target layer. The lower layer 200 may be formed of or include at least one of a semiconductor material, a conductive material, or an insulating material. The lower layer 200 may be a single layer or may include a plurality of stacked layers. Although not shown, at least one additional layer may be further provided between the substrate 100 and the lower layer 200.

The resist layer 300 may be formed by coating a resist compound on a top surface of the lower layer 200. The coating of the resist compound may be performed by, for example, a spin coating method. The resist layer 300 may have a relatively small thickness T1. In an embodiment, the thickness T1 of the resist layer 300 may range from 1 nm to 200 nm.

The charge dissipation layer 350 may be formed by coating a composition according to an embodiment of the inventive concepts on a top surface of the resist layer 300. The charge dissipation layer 350 may be an upper layer. In an embodiment, the composition may be prepared to contain a conductive polymer and a complex. The composition may further include an additive agent and/or a pH regulator. The coating of the composition may be performed by, for example, a spin coating method. The charge dissipation layer 350 may include substantially the same material as the composition. For example, the charge dissipation layer 350 may include the conductive polymer and the complex.

For example, the conductive polymer may include a polyacetylene (PA) or a derivative thereof, a poly paraphenylene (PPP) or a derivative thereof, a polyparaphenylene vinylene (PPV) or a derivative thereof, a polythiophene (PT) or a derivative thereof, a polypyrrole or a derivative thereof, a poly ethylene dioxythiophene (PEDOT) or a derivative thereof, a poly(2,5-dialkoxy) paraphenylene vinylene or a derivative thereof, a poly(3-alkylthiophene) (P3AT) or a derivative thereof, a polyfluorene or a derivative thereof, and/or a polyaniline or a derivative thereof. Poly(2,5-dialkoxy) paraphenylene vinylene and its derivatives may include, for example, poly[2-methoxy-5-(2'-ethylhexyloxy)-p-phenylene vinylene] (MEH-PPV).

In an embodiment, the conductive polymer may include a group of Chemical Formula A or a derivative thereof.

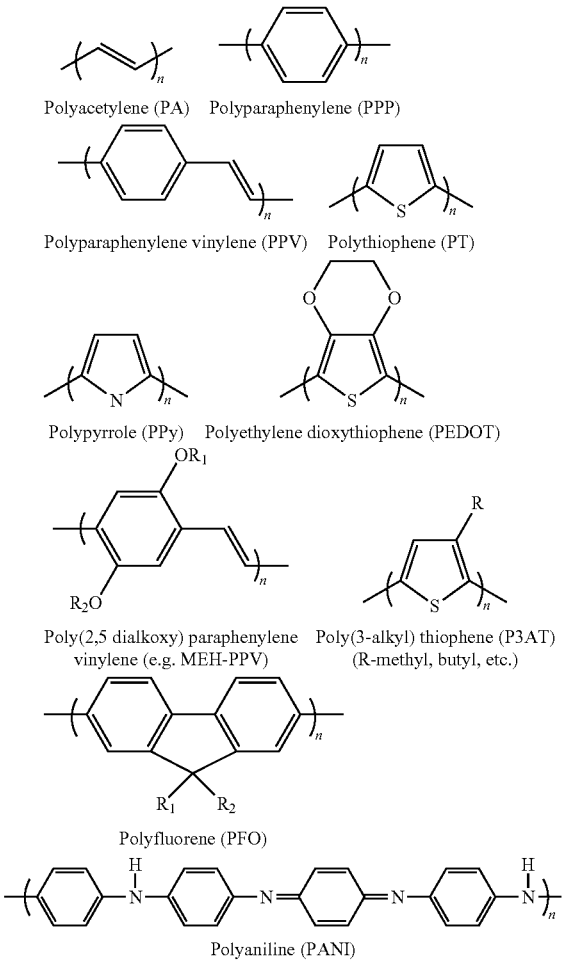

[Chemical Formula A]

Polyacetylene (PA)   Polyparaphenylene (PPP)

Polyparaphenylene vinylene (PPV)   Polythiophene (PT)

Polypyrrole (PPy)   Polyethylene dioxythiophene (PEDOT)

Poly(2,5 dialkoxy) paraphenylene vinylene (e.g. MEH-PPV)   Poly(3-alkyl) thiophene (P3AT) (R-methyl, butyl, etc.)

Polyfluorene (PFO)

Polyaniline (PANI)

In Chemical Formula A, R, $R_1$, and $R_2$ may each independently be a hydrogen, deuterium, or a substituted or unsubstituted alkyl having 1 to 5 carbon atoms, and n may be an integer between 3 to 500.

In an embodiment, the conductive polymer may include a hetero element. The hetero element may include at least one of nitrogen, sulfur, or oxygen.

The conductive polymer may comprise a structure of Chemical Formula A1.

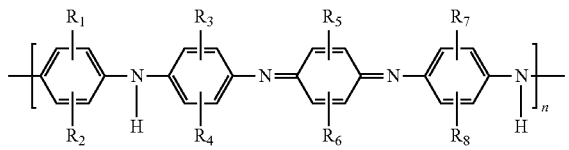

[Chemical Formula A1]

In Chemical Formula A1, $R_1$, $R_2$, $R_3$, $R_4$, $R_5$, $R_6$, $R_7$, and $R_8$ may each independently include a hydrogen, deuterium, alkyl having 1 to 5 carbon atoms, sulfonic acid, sulfonate, $-R_9SO_3H$, $-R_9SO_3A$, or $-R_9SO_3R_{10}$; $R_9$ and $R_{10}$ may each independently be a linear or branched alkyl having 1 to 5 carbon atoms; A may be $Na^+$ or $K^+$; and n may be an integer between 3 to 150.

The complex may be a metal complex. For example, the complex may include a metallic element and a ligand. For example, the complex may be a complex of Chemical Formula 1.

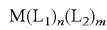
$$M(L_1)_n(L_2)_m \qquad \text{[Chemical Formula 1]}$$

In Chemical Formula 1, M may be a transition metal; $L_1$ and $L_2$ may each independently be a halogen element, —OR, OH, —SR, SH, —$NH_2$, $NR_2$, or —NRH, and R may be a linear or branched alkyl having 1 to 5 carbon atoms; n and m may each independently be an integer from 0 to 10; and a sum of n and m may be an integer selected between 2 and 10. The halogen element may include one selected from fluorine, chlorine, iodine, or bromine.

In an embodiment, the metallic element of the complex may be represented by M of Chemical Formula 1. The ligand of the complex may be represented by $L_1$ and $L_2$ of Chemical Formula 1. As an example, the complex may include $SnCl_4$ and/or $MoCl_5$.

An attractive force and/or a chemical bond may be provided between the complex and the conductive polymer. The attractive force may include an intermolecular attractive force, such as a hydrogen bond and/or a van der Waals bond. The chemical bond may include a covalent bond, a dative bond, and/or an ionic bond. The intermolecular attractive force or the chemical bond may be formed between the hetero element of the conductive polymer and the metallic element of the complex. Due to the intermolecular attractive force or the chemical bond, the hetero element of the conductive polymer may have a partial charge. The complex may have the partial charge. One of the partial charge of the complex and the partial charge of the hetero element may be a partial positive charge, and the other may be a partial negative charge. Accordingly, an electron mobility may be increased due to a polymer chain of the conductive polymer.

The charge dissipation layer 350 may further include a pH regulator. The pH regulator may include an acidic pH regulator or a basic pH regulator. The acidic pH regulator may include an acidic material. The acidic material may include, for example, sulfuric acid, hydrochloric acid, and/or nitric acid. The basic pH regulator may include a basic material. The basic material may include, for example, a nitrogen-containing basic material. For example, the basic material may include ammonia and/or ammonium salt. The ammonium salt may include at least one of tetramethylammonium hydroxide (TMAH) or tetrakis(ethylmethylamido) hafnium (TEMAH). The electric conductivity of the conductive polymer may be greater in the acidic or basic environment than in a neutral environment. When the charge dissipation layer 350 includes a pH regulator, the conductive polymer may be provided in an acidic or basic environment. For example, the charge dissipation layer 350 may have a pH value that is less than 3 or is greater than 11. Accordingly, the electric conductivity of the charge dissipation layer 350 may be increased. When the charge dissipation layer 350 has a pH value between 3 and 11, the electric conductivity of the charge dissipation layer 350 may be relatively low. In the present specification, the term "conductivity" will be used to refer to the electric conductivity, unless the context clearly indicates otherwise.

The charge dissipation layer 350 may further include an additive agent. The additive agent may include an anionic additive agent, a cationic additive agent, and/or a non-ionic additive agent. The anionic additive agent may include, for example, alkyl-aryl sulfates, perfluoro sulfates, sulfonates, phosphates, and/or carboxylates. The cationic additive agent may include a material including a primary amine group, a material including a secondary amine group, a material including a tertiary amine group, and/or a quaternary ammonium salt. The non-ionic additive agent may include alkyl-aryl ethoxylates, perfluoro ethoxylates, esters, polyglucosides, amine oxides, sulfoxides, and/or phosphine oxides. When the composition includes an additive agent, the solubility of the conductive polymer and/or complex may be improved. The charge dissipation layer 350 may have a relatively small thickness T2. For example, the thickness T2 of the charge dissipation layer 350 may range from about 0.5 nm to about 10 nm.

Figure 2:
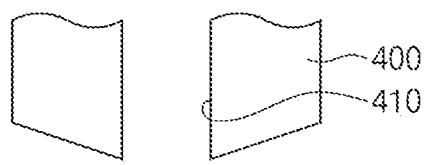
FIGS. 2, 3A, 4, and 5 are diagrams illustrating a method of forming a pattern, according to an embodiment of the inventive concepts.
Figure 2:
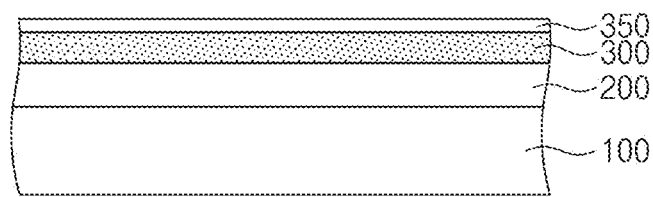

Referring to FIG. 2, an exposure system 400 may be spaced apart from a top surface of the charge dissipation layer 350. The exposure system 400 may include an electron beam exposure system or an ion beam exposure system. The exposure system 400 may have an opening 410. The shape and position of the opening 410 of the exposure system 400 may be designed and determined, depending on a shape and position of a lower pattern 200P to be described with reference to FIG. 5 or FIG. 7.

The charge dissipation layer 350 may have a first region and a second region, when viewed in a plan view. The opening 410 of the exposure system 400 may be disposed on the second region of the charge dissipation layer 350 and may be overlapped with the second region, when viewed in a plan view. The opening 410 of the exposure system 400 may not be vertically overlapped with the first region of the charge dissipation layer 350, when viewed in a plan view.

Figure 3A:
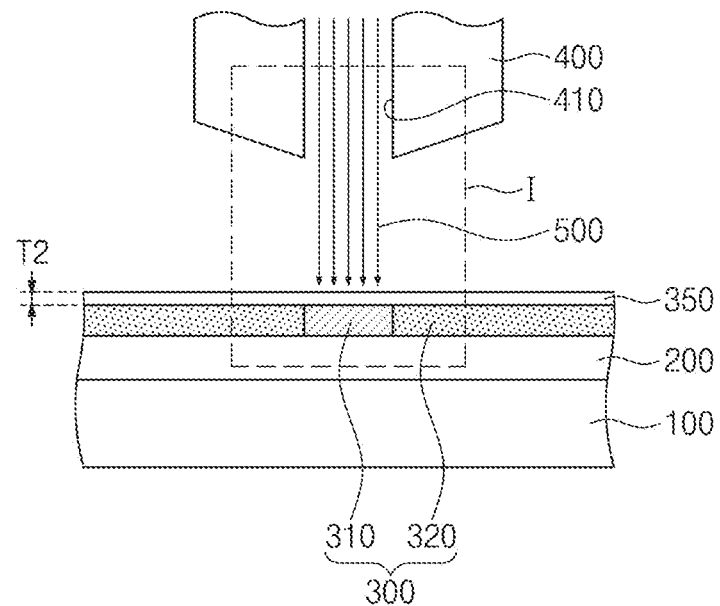
Figure 3B:
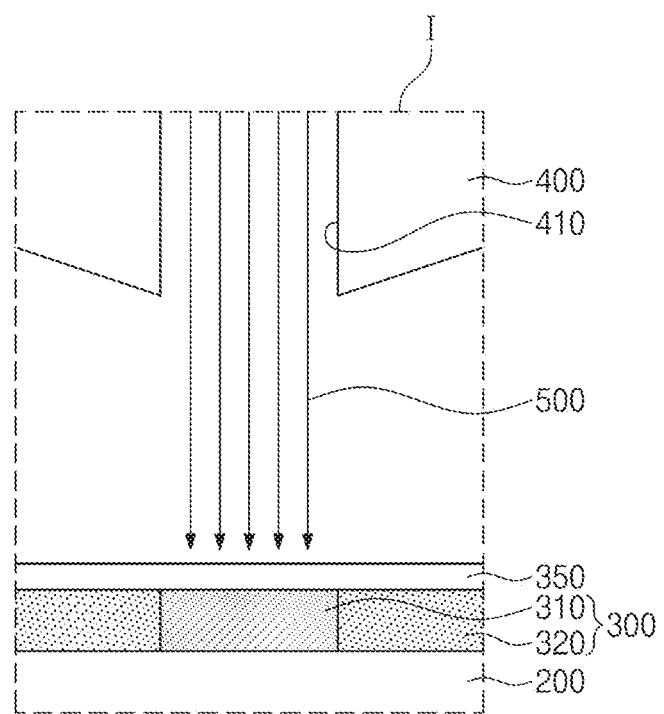
FIG. 3B is an enlarged view of a portion 'I' of FIG. 3A.

Referring to FIGS. 3A and 3B, the exposure process may be performed on the charge dissipation layer 350. A beam 500 may be irradiated onto the charge dissipation layer 350 through the opening 410 of the exposure system 400. The beam 500 may be electrically charged. For example, the beam 500 may be an electron beam or an ion beam. In another example, the exposure process is performed using ultraviolet light or extreme ultraviolet.

The resist layer 300 may include a first portion 310 and a second portion 320. Before the exposure process, the second portion 320 of the resist layer 300 may be formed of or include the same material as the first portion 310 and may be connected to the first portion 310 without any interface therebetween. For example, a material of the second portion 320 of the resist layer 300 may have the same chemical structure as a material of the first portion 310. One of the first and second portions 310 and 320 of the resist layer 300 may be a portion, which will be used as a resist pattern 300P of FIG. 4. The first portion 310 of the resist layer 300 may be designed as a portion that will be exposed to the beam 500, and the second portion 320 may be designed as a portion that will not be exposed to the beam 500. The design of the exposure and non-exposure portions may be determined by the position and shape of the opening 410 of the exposure system 400.

The beam 500 may be irradiated onto a top surface of the first region of the charge dissipation layer 350. The irradiated first region of the charge dissipation layer 350 may be overlapped with the first portion 310 of the resist layer 300. Since the charge dissipation layer 350 has a thin thickness (e.g., the thickness T2), the beam 500 or its energy may be transferred to the resist layer 300 through the charge dissipation layer 350. This may lead to a change in chemical structure of the first portion 310 of the resist layer 300. Since the charge dissipation layer 350 has the thickness T2 of 10 nm or less, the charge dissipation layer 350 may prevent the beam 500 from being excessively scattered. The second region of the charge dissipation layer 350 may not be exposed to the beam 500. The second region of the charge dissipation layer 350 may be overlapped with the second portion 320 of the resist layer 300. The chemical structure of the second portion 320 of the resist layer 300 may not be changed. After the irradiation of the beam 500, the first portion 310 of the resist layer 300 may have a different chemical structure from the second portion 320.

Figure 3C:
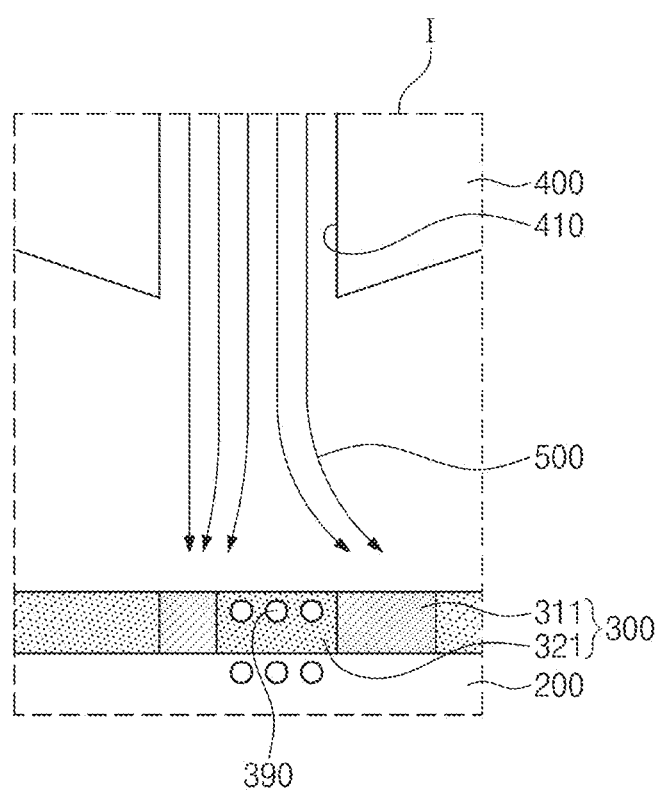
FIG. 3C is a diagram illustrating an exposure process according to an embodiment of the inventive concepts.

FIG. 3C is an enlarged sectional view of a portion 'I' of FIG. 3A, which is provided to illustrate an exposure process according to an embodiment of the inventive concepts.

Referring to FIG. 3C, when the charge dissipation layer 350 is not provided, electric charges 390 may accumulate in the resist layer 300 during the exposure process. For example, the electric charges 390 may be accumulated by the irradiation of the beam 500. Since the resist layer 300 has a relatively small thickness, the beam 500 may pass through the resist layer 300 and may be incident into an upper portion of the lower layer 200. Accordingly, the electric charges 390 may also be produced in an upper portion of the lower layer 200.

The beam 500 may interact with the electric charges 390. For example, the beam 500 may be deflected by the interaction with the electric charges 390. After the exposure process, the resist layer 300 may include an exposed portion 311 and an unexposed portion 321. Due to the deflection of the beam 500, at least a portion of the exposed portion 311 of the resist layer 300 may be formed at a region that is not overlapping with the opening 410 of the exposure system 400. At least a portion of the unexposed portion 321 of the resist layer 300 may be overlapped with the opening 410 of the exposure system 400, when viewed in a plan view. The positions of the exposed and unexposed portions 311 and 321 of the resist layer 300 may be different from the designed positions. Due to the electric charges 390, it may be difficult to control the positions of the exposed and unexposed portions 311 and 321 of the resist layer 300.

In the present specification, the term "vertical" may be used to refer to a direction that is substantially normal to a top surface of the substrate 100.

Referring back to FIGS. 3A and 3B, the charge dissipation layer 350 may be formed on the resist layer 300 to cover the resist layer 300. In the exposure process, the charge dissipation layer 350 may be used to dissipate the electric charges 390 (e.g., see FIG. 3C) accumulated in the resist layer 300 or the lower layer 200. In the case where the electric charges 390 in the resist layer 300 are removed, the beam 500 may be irradiated onto a desired region of the charge dissipation layer 350. In the present specification, the desired position/region may correspond to a designed position/region. For example, the beam 500 may be irradiated onto the first portion 310 of the resist layer 300 through the first region of the charge dissipation layer 350, and here, the first portion 310 may be overlapped with the opening 410 of the exposure system 400. The beam 500 may not be irradiated onto the top surface of the second region of the charge dissipation layer 350 and the second portion 320 of the resist layer 300. The second region of the charge dissipation layer 350 and the second portion 320 of the resist layer 300 may correspond to regions that are not overlapped with the opening 410 of the exposure system 400, when viewed in a plan view.

The higher the electric conductivity of the charge dissipation layer 350, the smaller the accumulation of the electric charges. In an embodiment, the charge dissipation layer 350 may include the conductive polymer and the complex, and the electric conductivity of the charge dissipation layer 350 may be improved by the intermolecular attractive force and/or the chemical bond between the complex and the conductive polymer. Accordingly, it may be possible to improve the precision and/or accuracy in the exposure process.

Temperature in a chamber may be increased, during the exposure process. For example, during the exposure process, the temperature in the chamber may be from 90° C. to 250° C., and the charge dissipation layer 350 may be placed under such a temperature condition. In the exposure process, the chamber temperature may be increased by a reduction in optical wavelength of light for the beam 500 or by an increase in irradiation amount and/or intensity of the beam 500. Under the temperature condition, a pH regulator may be diffused into the resist layer 300. In the case where the complex is omitted, as the exposure process proceeds, the content of the pH regulator in the charge dissipation layer 350 may decrease and the electric conductivity of the charge dissipation layer 350 may decrease. As the exposure process proceeds, it may become difficult to remove the electric charges from the resist layer 300 or the lower layer 200 through the charge dissipation layer 350.

According to an embodiment of the inventive concepts, even when the exposure process is performed under a temperature condition from 90° C. to 250° C., the charge dissipation layer 350 may be maintained to have relatively high electric conductivity, due to the intermolecular attractive force and/or the chemical bond between the complex and the conductive polymer. Accordingly, the first and second portions 310 and 320 of the resist layer 300 may be formed at the designed positions, after the exposure process. It may be possible to improve precision and/or accuracy in the exposure process.

In the case where the charge dissipation layer 350 does not include the complex, the charge dissipation layer 350 may be deformed under a temperature condition between 90° C. and 250° C. For example, the chemical structure of the conductive polymer may be changed. In another example, under a temperature condition between 90° C. and 250° C., the conductive polymer may react with the resist layer 300, and thus, a chemical bond may be formed between the conductive polymer and the resist layer 300. According to an embodiment of the inventive concepts, even when the conductive polymer is exposed to a high temperature exposure process, it may be possible to stably maintain the chemical structure of the conductive polymer and to prevent a chemical bond from being formed between the conductive polymer and the resist layer 300, due to the interaction or chemical bond between the conductive polymer and the complex.

Figure 4:
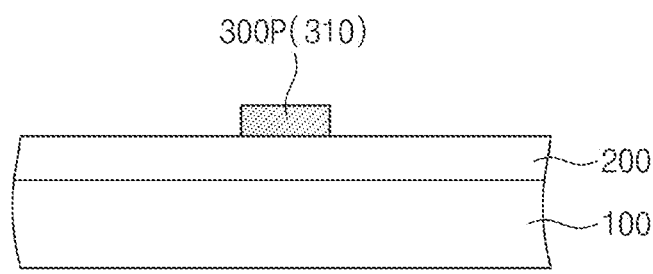

Referring to FIG. 4, a developing process may be performed on the charge dissipation layer 350 to remove the charge dissipation layer 350 and the second portion 320 of the resist layer 300. As a result, the resist pattern 300P may be formed. The resist pattern 300P may be formed by a patterning process, which includes the exposure and developing processes performed on the resist layer 300. The resist pattern 300P may correspond to the first portion 310 of the resist layer 300. As another example, the charge dissipation layer 350 may be removed, before the developing process. The process of removing the charge dissipation layer 350 may be a separate process different from the developing process of the resist layer 300.

In the case where the charge dissipation layer 350 is deformed, it may be difficult to fully remove the charge dissipation layer 350. At least a portion of the charge dissipation layer 350 may be left on the resist layer 300. The deformation of the charge dissipation layer 350 may include a change in the chemical structure of the conductive polymer or the formation of the conductive polymer bonded with the resist layer 300. The remaining portion of the charge dissipation layer 350 may hinder the second portion 320 of the resist layer 300 from being normally developed. In this case, it may be difficult to form the resist pattern 300P in a desired pitch and shape. According to an embodiment of the inventive concepts, since the charge dissipation layer 350 includes the complex, it may be possible to prevent the charge dissipation layer 350 from being deformed. Accordingly, the resist pattern 300P may be formed at a desired position, with high accuracy and/or precision.

Figure 5:
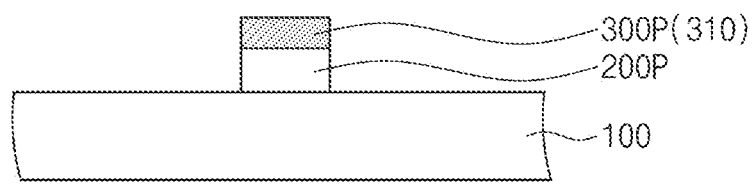

Referring to FIG. 5, the lower layer 200 exposed by the resist pattern 300P may be removed to form the lower pattern 200P. The removal of the lower layer 200 may be performed by an etching process. The lower layer 200 may have an etch selectivity with respect to the resist pattern 300P. The lower pattern 200P may be formed to expose the substrate 100. In another example, the lower pattern 200P may be formed to expose another layer interposed between the substrate 100 and the lower pattern 200P. The afore-described process or method may be used to form a pattern. The pattern may mean the lower pattern 200P.

In an embodiment, the lower pattern 200P may be a part of a semiconductor device. For example, the lower pattern 200P may be a semiconductor pattern, a conductive pattern, or an insulating pattern constituting a semiconductor device. A method of fabricating a semiconductor device may include the afore-described pattern-forming method.

Figure 6:
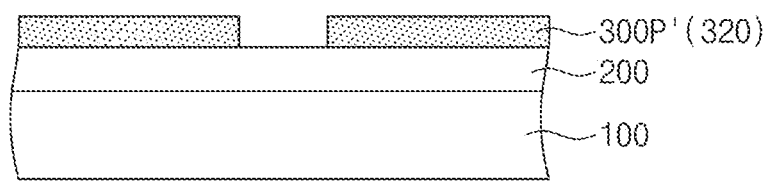
FIGS. 6 and 7 are sectional views illustrating a method of forming a lower pattern, according to an embodiment of the inventive concepts.
Figure 7:
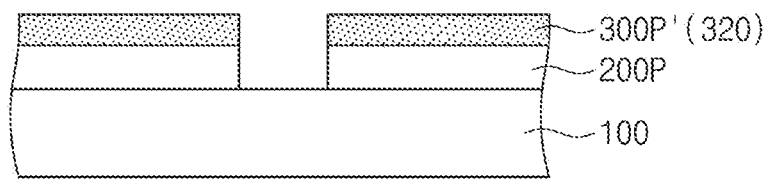

FIGS. 6 and 7 are sectional views illustrating a method of forming a lower pattern, according to an embodiment of the inventive concepts.

Referring to FIG. 3A, the lower layer 200, the resist layer 300, and the charge dissipation layer 350 may be formed on the substrate 100. An exposure process using the exposure system 400 may be performed on the charge dissipation layer 350. When the irradiation of the beam 500 is finished, the first portion 310 of the resist layer 300 may have a different chemical structure from the second portion 320 of the resist layer 300.

Referring to FIG. 6, the first portion 310 of the resist layer 300 may be removed by a developing process, and as a result, a resist pattern 300P' may be formed. During the developing process, the charge dissipation layer 350 may be removed along with the first portion 310 of the resist layer 300. The second portion 320 of the resist layer 300 may not be removed by the developing solution. The resist pattern 300P' may correspond to the second portion 320 of the resist layer 300. As another example, after the removal process of the charge dissipation layer 350, a developing process may be performed on the resist layer 300.

Referring to FIG. 7, the lower layer 200 may be etched to form the lower pattern 200P. The lower pattern 200P may be formed at a position corresponding to the resist pattern 300P'. The etching of the lower layer 200 may be performed in substantially the same manner as that described with reference to FIG. 5. Thereafter, the resist pattern 300P' may be removed.

Hereinafter, a compound and a charge dissipation layer therewith will be described in more detail with reference to experimental examples of the inventive concepts and comparative examples.

1. COMPARATIVE EXAMPLE 1

Poly aniline aqueous solution (3.2 mmol) dissolved in 1M HCl 10 mL and ammonium peroxydisulfate solution (0.8 mmol) dissolved in 1M HCl 10 mL were mixed at a temperature of 25° C. to prepare a mixture. After 12 hours, the mixture was filtered and washed using 1M HCl. The filtering and washing were repeated until the mixture was colorless. The resultant material was dried under a vacuum condition at a temperature of 50° C. The dried material was dissolved in 1M HCl, was treated with ammonium hydroxide (0.1M) for 11 hours, and then, was cleaned with deionized water until it was neutralized. The material was dried at a temperature of 60° C. to obtain a compound.

The compound was coated on a glass substrate to form a layer. Thereafter, the layer was dried at a temperature of 60° C. for 12 hours.

Immediately after the layer was prepared, the electric conductivity of the layer was analyzed at a temperature of 25° C. The layer was exposed to a temperature of 150° C. for 100 minutes, and then, the electric conductivity of the layer was analyzed. The electric conductivity of the layer was analyzed using a four-point probe.

2. EXPERIMENTAL EXAMPLE 1

A layer was prepared by the same method as that in the comparative example 1. The layer was exposed to a vapor of $SnCl_4$ (from Sigma) for 0.1 seconds. Thereafter, a purging was performed using a nitrogen gas for 60 seconds. The exposing of the layer to the $SnCl_4$ vapor and the purging were performed 60 times at a temperature of 150° C. and under a pressure condition of 50 mTorr.

Immediately after the layer was prepared, the electric conductivity of the layer was analyzed at a temperature of 25° C. The layer was exposed to a temperature of 150° C. for 100 minutes, and then, the electric conductivity of the layer was analyzed. The electric conductivity of the layer was analyzed using a four-point probe.

3. EXPERIMENTAL EXAMPLE 2

A solid of $MoCl_5$ (from Sigma) was heated to a temperature of 85° C. to obtain a vapor of $MoCl_5$. A layer was prepared by the same method as that in the comparative example 1. The layer was exposed to the vapor of $MoCl_5$ for 0.5 seconds. Thereafter, a purging was performed using a nitrogen gas for 60 seconds. The exposing of the layer to the vapor of $MoCl_5$ and the purging were performed 100 times at a temperature of 150° C. and under a pressure condition of 50 mTorr.

Immediately after the layer was prepared, the electric conductivity of the layer was analyzed at a temperature of 25° C. The layer was exposed to a temperature of 150° C. for 100 minutes, and then, the electric conductivity of the layer was analyzed. The electric conductivity of the layer was analyzed using a four-point probe.

Table 1 summarizes materials included in the layers according to the comparative example 1, the experimental example 1, and the experimental example 2, and their electric conductivity.

TABLE 1

| | Material in layer | | Electric conductivity ($Scm^1$) | |
| --- | --- | --- | --- | --- |
| | Conductive Polymer | Complex | 25° C. | 150° C. |
| Comparative Example 1 | poly aniline | — | $8.23 \times 10^2$ | $8.19 \times 10^8$ |
| Experimental Example 1 | poly aniline | $SnCl_4$ | $1.03 \times 10^5$ | $3 \times 10^6$ |
| Experimental Example 2 | poly aniline | $MoCl_5$ | $2.93 \times 10^4$ | $2.07 \times 10^5$ |

Referring to Table 1, the electric conductivity at the temperature of 150° C. was higher in the experimental examples 1 and 2 than in the comparative example 1. The electric conductivity at the temperature of 150° C. in the comparative example 1 was significantly reduced, compared with the electric conductivity at the temperature of 25° C. The layer in the comparative example 1 did not include the complex. The layers in the experimental examples 1 and 2 included the complex, and the higher electric conductivity at the temperature of 150° C. is thought to be caused by the presence of the complex.

4. COMPARATIVE EXAMPLE 2

A photoresist material was coated on a substrate to form a resist layer. An electron beam of 50 keV was irradiated onto the resist layer using a Monte Carlo simulation (GEANT4) apparatus to analyze scattering characteristics. Here, the scattering characteristics of the electron beam according to a thickness of the resist layer were analyzed.

5. EXPERIMENTAL EXAMPLE 4

A photoresist material was coated on a substrate to form a resist layer. A charge dissipation layer including poly aniline and a metal complex was formed on the resist layer. $SnCl_4$ was used as the metal complex, and the charge dissipation layer was formed to have a Sn density of 1.053 g/cm$^3$. Thereafter, an electron beam of 50 keV was irradiated onto the charge dissipation layer using a Monte Carlo simulation (GEANT4) apparatus to analyze scattering characteristics of the electron beam. Here, the scattering characteristics of the electron beam according to a thickness of the charge dissipation layer were analyzed.

6. EXPERIMENTAL EXAMPLE 5

A photoresist material was coated on a substrate to form a resist layer. A charge dissipation layer including poly aniline and a metal complex was formed on the resist layer. $SnCl_4$ was used as the metal complex, and the charge dissipation layer was formed to have a Sn density of 1.116 g/cm$^3$. Thereafter, an electron beam of 50 keV was irradiated onto the charge dissipation layer using a Monte Carlo simulation (GEANT4) apparatus to analyze scattering characteristics of the electron beam. Here, the scattering characteristics of the electron beam according to a thickness of the charge dissipation layer were analyzed.

7. EXPERIMENTAL EXAMPLE 6

A photoresist material was coated on a substrate to form a resist layer. A charge dissipation layer including poly aniline and a metal complex was formed on the resist layer. $SnCl_4$ was used as the metal complex, and the charge dissipation layer was formed to have a Sn density of 1.003 g/cm$^3$. Thereafter, an electron beam of 50 keV was irradiated onto the charge dissipation layer using a Monte Carlo simulation (GEANT4) apparatus to analyze scattering characteristics of the electron beam. Here, the scattering characteristics of the electron beam according to a thickness of the charge dissipation layer were analyzed.

Figure 8:
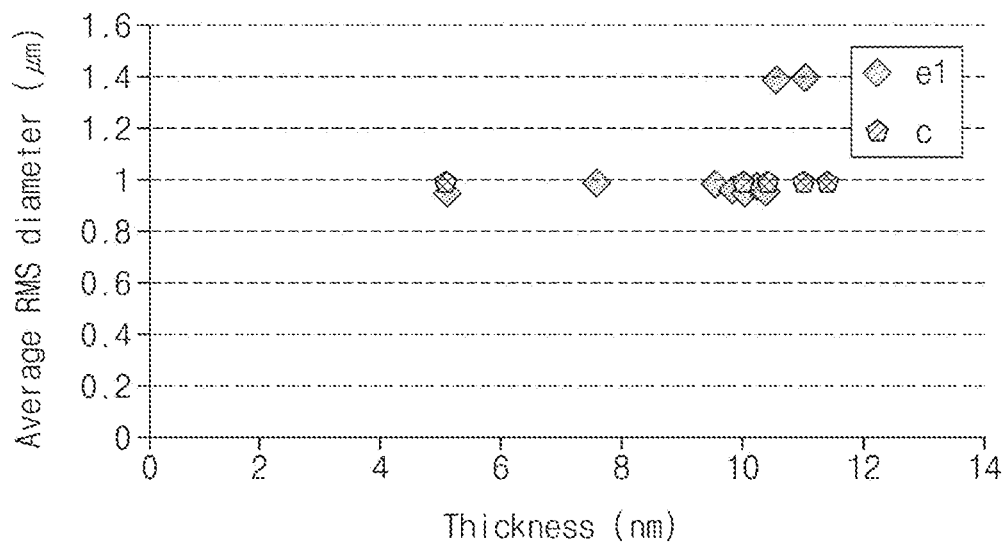
FIG. 8 is a graph showing scattering characteristics of electron beams, in comparative example 2 (c) and experimental example 4 (e1).
Figure 9:
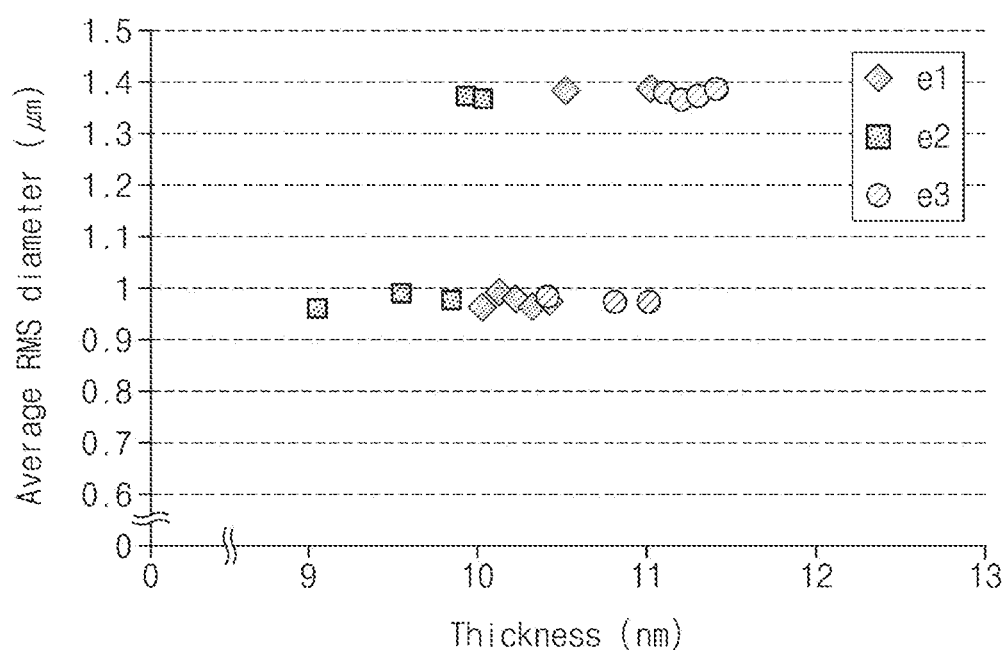
FIG. 9 is a graph showing scattering characteristics of electron beams, in experimental example 4 (e1), experimental example 5 (e2), and experimental example 6 (e3).

FIG. 8 is a graph showing scattering characteristics of electron beams from comparative example 2 and experimental example 4. The horizontal axis represents the thickness of the charge dissipation layer in experimental example 4. In the case of comparative example 2, the thickness in the horizontal axis represents a difference between the thickness of the resist layer in comparative example 2 and the thickness of a corresponding resist layer in experimental example 4. The vertical axis represents an average root-mean square (RMS) diameter of the scattered electron beam. FIG. 9 is a graph showing the scattering characteristics of electron beams from experimental examples 4, 5, and 6. The horizontal axis represents the thickness of the charge dissipation layers in the experimental examples 4, 5, and 6, and the vertical axis represents the average RMS diameter of the scattered electron beam.

Referring to FIG. 8, in the case where the charge dissipation layer in the experimental example 4 (e1) has a thickness of 10 nm or less, the scattering characteristics of the electron beam in the experimental example 4 (e1) were substantially the same as those by the resist layer in the comparative example 2 (c), although it further includes the metal complex.

Referring to FIGS. 8 and 9, in the case where the charge dissipation layers in experimental example 5 (e2) and experimental example 6 (e3) have a thickness of 10 nm or less, the scattering characteristics of the electron beam in experimental examples 5 and 6 (e2, e3) were substantially the same as those of the resist layer in comparative example 2 (c) and as in experimental example 4 (e1). According to an embodiment of the inventive concepts, by adjusting the thickness of the charge dissipation layer, it may be possible to prevent the beam from being excessively scattered by the charge dissipation layer. Accordingly, it may be possible to improve precision and position accuracy in the patterning process.

According to an embodiment of the inventive concepts, a charge dissipation layer may include a conductive polymer and a complex. A chemical bond and/or an intermolecular attractive force may be provided between the conductive polymer and the complex, and in this case, the charge dissipation layer may have a high electric conductivity. Since the complex is provided, the structure of the conductive polymer may be stably maintained at even a high temperature. According to an embodiment of the inventive concepts, it may be possible to improve precision and/or position-accuracy in a pattern-forming method. A pattern may be formed in a fine pitch.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   providing a substrate comprising a resist layer on the substrate; and
   coating a compound on the resist layer to form a charge dissipation layer,
   wherein the charge dissipation layer comprises a conductive polymer and a transition metal complex.

2. The method of claim 1, wherein the transition metal complex includes a material of Chemical Formula 1:

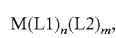  [Chemical Formula 1]

wherein:
M is a transition metal;
L1 and L2 are each independently a halogen element, —OR, OH, —SR, SH, —NH$_2$, NR$_2$, or —NRH, and R is a linear or branched alkyl having 1 to 5 carbon atoms;
n and m are each independently an integer from 0 to 10; and
a sum of n and m is an integer between 2 and 10.

3. The method of claim 1, wherein the transition metal complex comprises at least one selected from the group of Mo, Sn, and Ti.

4. The method of claim 1, further comprising performing an exposure process and a developing process on the charge dissipation layer to pattern the resist layer.

5. The method of claim 4, wherein the exposure process is performed using ultraviolet light, electron beam, or extreme ultraviolet, and at a temperature ranging from 90° C. to 250° C.

6. The method of claim 1, wherein the conductive polymer comprises a hetero element.

7. The method of claim 1, wherein the conductive polymer comprises at least one selected from the group of a poly aniline and a derivative thereof.

8. The method of claim 1, wherein a chemical bond or an intermolecular attractive force is provided between the conductive polymer and the transition metal complex.

9. The method of claim 1, wherein the compound further comprises an acidic pH regulator or a basic pH regulator.

10. A method of forming a pattern, comprising:
providing a substrate comprising a resist layer on the substrate; and
forming a charge dissipation layer on the resist layer,
wherein the charge dissipation layer comprises a material of Chemical Formula 1:

$$M(L1)_n(L2),$$ [Chemical Formula 1]

wherein:
M is a transition metal;
L1 and L2 are each independently a halogen element, —OR, OH, —SR, SH, —NH$_2$, NR$_2$, or —NRH, and R is a linear or branched alkyl having 1 to 5 carbon atoms;
n and m are each independently an integer from 0 to 10; and
a sum of n and m is an integer between 2 and 10.

11. The method of claim 10, wherein the charge dissipation layer comprises a conductive polymer.

12. The method of claim 11, wherein the conductive polymer comprises at least one selected from polyacetylene, a derivative of polyacetylene, poly-paraphenylene, a derivative of polyparaphenylene, poly-paraphenylene vinylene, a derivative of polyparaphenylene vinylene, polythiophene, a derivative of polythiophene, polypyrrole, a derivative of polypyrrole, poly-ethylene dioxythiophene (PEDOT), a derivative of PEDOT, poly(2,5-dialkoxy) paraphenylene vinylene, a derivative of poly(2,5-dialkoxy) paraphenylene vinylene, poly(3-alkylthiophene), a derivative of poly(3-alkylthiophene), polyfluorene, a derivative of polyfluorene, polyaniline, and a derivative of polyaniline.

13. The method of claim 10, wherein L1 and L2 each independently comprise a halogen element.

14. The method of claim 10, wherein the charge dissipation layer further comprises sulfuric acid, hydrochloric acid, nitric acid, ammonia, and/or ammonium salt.

15. The method of claim 10, wherein the material of Chemical Formula 1 includes at least one selected from the group of SnCl$_4$ and MoCl$_5$.

16. A method of forming a pattern, comprising:
providing a substrate comprising a resist layer on the substrate;
coating a composition on the resist layer to form an upper layer; and
performing an exposure process on the upper layer,
wherein the composition comprises:
a polymer including a hetero element; and
a material of Chemical Formula 1:

$$M(L1)_n(L2)_m,$$ [Chemical Formula 1]

wherein:
M is a transition metal;
L1 and L2 are each independently a halogen element, —OR, OH, —SR, SH, —NH$_2$, NR$_2$, or —NRH, and R is a linear or branched alkyl having 1 to 5 carbon atoms;
n and m are each independently an integer from 0 to 10; and
a sum of n and m is an integer between 2 and 10.

17. The method of claim 16, wherein the polymer comprises a conductive polymer.

18. The method of claim 16, wherein the hetero element comprises N, S, or O.

19. The method of claim 16, wherein the composition has a pH value that is less than 3 or is greater than 11.

20. The method of claim 16, further comprising:
forming a lower layer on the substrate, the resist layer being formed on the lower layer;
after the exposure process, removing a portion of the resist layer to form a resist pattern; and
etching the lower layer exposed by the resist pattern.

* * * * *